(12) United States Patent
Okuyama (10) Patent No.: US 6,999,158 B2
(45) Date of Patent: Feb. 14, 2006

(54) APPARATUS FOR FORMING PATTERN

(75) Inventor: Takashi Okuyama, Saitama (JP)

(73) Assignee: PENTAX Corporation, Tokyo (JP)

( * ) Notice: Subject to any disclaimer, the term of this patent is extended or adjusted under 35 U.S.C. 154(b) by 65 days.

(21) Appl. No.: 10/834,239

(22) Filed: Apr. 29, 2004

(65) Prior Publication Data

US 2004/0218161 A1    Nov. 4, 2004

(30) Foreign Application Priority Data

May 1, 2003    (JP)    ............................ P2003-126309

(51) Int. Cl.
| G03B 27/42 | (2006.01) |
| G03B 27/54 | (2006.01) |
| B41J 2/47  | (2006.01) |
| B41J 2/435 | (2006.01) |

(52) U.S. Cl. .................... 355/53; 355/67; 347/225; 347/249

(58) Field of Classification Search .............. 356/3.09, 356/431; 347/249, 229, 230, 242, 254
See application file for complete search history.

(56) References Cited

U.S. PATENT DOCUMENTS

| 5,241,330 A | 8/1993 | Kawabata et al. |
| 5,247,373 A | 9/1993 | Iwama et al. |
| 5,436,728 A | 7/1995 | Watanabe |

FOREIGN PATENT DOCUMENTS

JP    2549011    8/1996

*Primary Examiner*—Judy Nguyen
(74) *Attorney, Agent, or Firm*—Greenblum & Bernstein, P.L.C.

(57) ABSTRACT

An apparatus for forming a pattern has a light source, a scanning unit, a memory, a pulse data selector, a control pulse signal generator, a control pulse signal generator, a writing pulse signal generator, and an optical modulator. The time-interval detector detects successively a time-interval that is a pass-time of the beam in each of a series of fine sections. The pulse data selector selects a set of pulse data, corresponding to the detected time-interval, from a series of sets of pulse data. The control pulse signal generator successively generates a sequence of control pulse signals in accordance with the selected set of pulse data.

8 Claims, 9 Drawing Sheets

APPARATUS FOR FORMING PATTERN

BACKGROUND OF THE INVENTION

1. Field of the Invention

The present invention relates to a beam writer that forms a circuit pattern on a substrate such as a film board and a glass board, or that forms an image on a sheet for recording. Especially, it relates to controlling beam-modulation.

2. Description of the Related Art

A beam writer, such as laser writer, forms an electric circuit pattern on a substrate, such as a silicon wafer, and so on. While, a laser scanner forms an image on a paper. The above beam writer has, for example, an exposure optical system with a polygon mirror and an f-θ lens, and scans an electronic beam or laser beam on a photosensitive material by using the exposure optical system. Then, an optical-modulator incorporated in the exposure optical system, such as an AOM (Acousto-Optical Modulator), modulates the beam. Namely, the optical modulator controls the exposure on the photosensitive material by passing and intercepting the beam in accordance with pattern-data. The beam modulation is controlled by a sequence of high frequency control pulse signals.

The scanning-speed of the beam is not always constant due to the precision of the f-θ lens and the polygon mirror. The differing precision results in an irregular scanning-speed, in other words, the irregular scanning-speed is caused by degrees of the precision. To correct the irregular scanning-speed, the frequency of the control pulse signals for modulating the beam is modified in accordance with the variation of the scanning-speed. For example, a scanning line is divided into constant distance-intervals, and a time-interval, which is a pass-time of the beam in each distance-interval, is successively measured along the scanning-line before forming the pattern. Then, when scanning the beam, the clock frequency is adjusted in accordance with the detected series of time-intervals. In order to minimize a dot-pitch of the pattern, as much as possible, a PLL (Phase-Locked Loop) circuit is utilized to generate clock pulses with an accurate frequency.

SUMMARY OF THE INVENTION

An object of the present invention is to provide an apparatus that rapidly and effectively forms a pattern in accordance with a varying scanning-speed, an apparatus that generates a sequence of control pulse signals for forming a pattern, and a method that generates a sequence of control pulse signals for forming a pattern.

An apparatus for forming a pattern according to the present invention has a light source, a scanning unit, a memory, a pulse-data selector, a control-pulse signal generator, a writing-pulse signal generator, and an optical modulator. The light source emits a beam, and the scanning unit scans the beam on a photosensitive material, such as a substrate, a photoreceptor, and so on.

The time-interval detector successively detects a time-interval that is the time it takes the beam to pass over each of a series of fine sections. The series of fine sections is defined by dividing a scanning-line at constant-intervals larger than a dot-pitch. The memory is capable of storing a series of sets of pulse data. The pulse data have a different data-array in accordance with the time-intervals, which vary with the scanning-speed. The pulse data selector selects a set of pulse data, corresponding to the detected time-interval, from the series of sets of pulse data. The control pulse signal generator successively generates a sequence of control pulse signals in accordance with the selected set of pulse data. The writing pulse signal generator successively generates a sequence of writing pulse signals in accordance with the control pulse signal. The sequence of control pulse signals controls the output-timing of the sequence of writing pulse signals. The optical modulator modulates the beam in accordance with the sequence of writing pulse signals.

BRIEF DESCRIPTION OF THE DRAWINGS

The present invention will be better understood from the description of the preferred embodiment of the invention set fourth below together with the accompanying drawings, in which.

DESCRIPTION OF THE PREFERRED EMBODIMENTS

Hereinafter, the preferred embodiment of the present invention is described with reference to the attached drawings.

Figure 1:
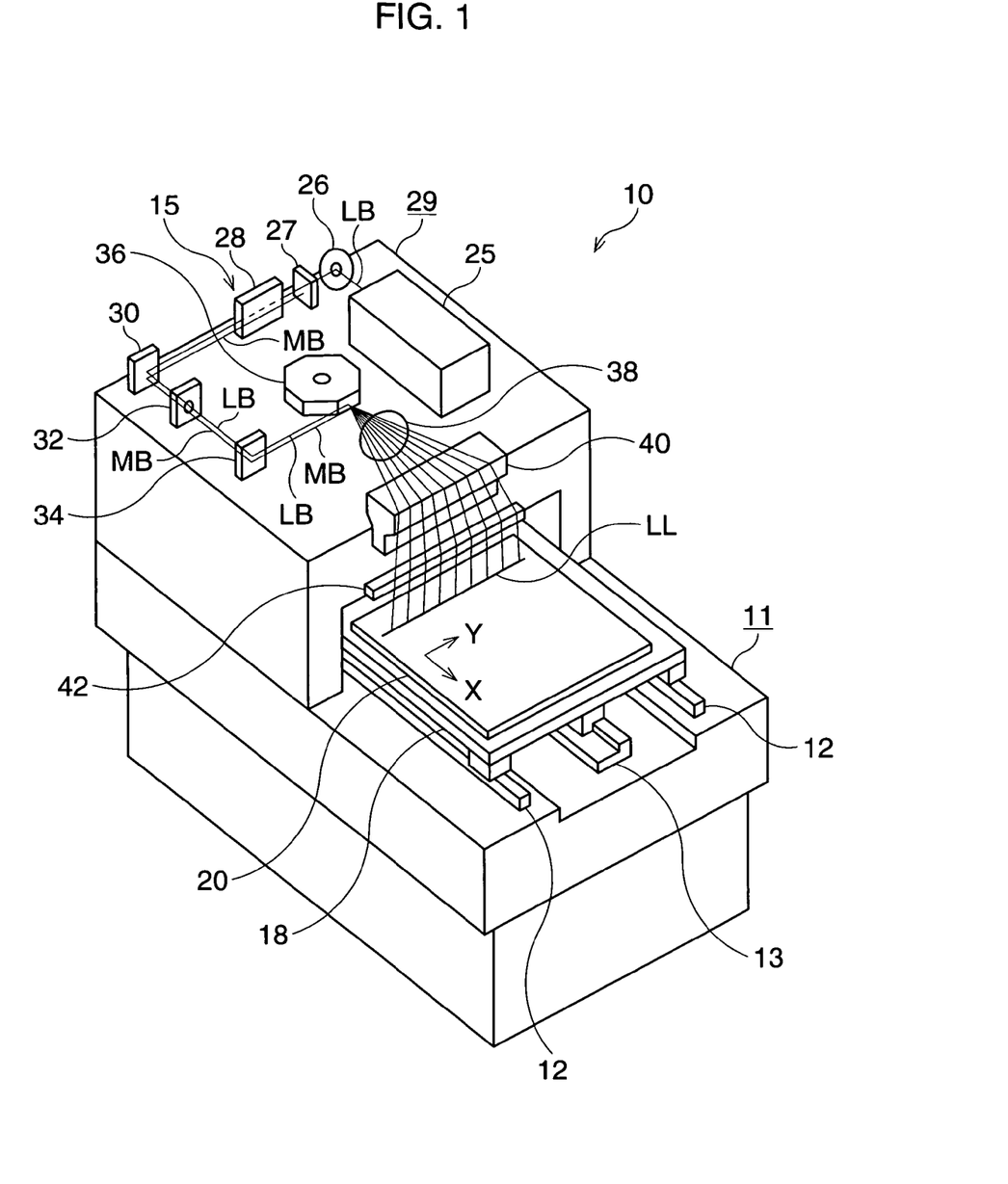
FIG. 1 is a schematic view of a laser writer according to an embodiment of the invention.

FIG. 1 is a schematic view of a laser writer according to an embodiment of the invention.

The laser writer 10 scans a laser beam on a substrate 20, such as a glass board or a film for a PWB (Printed Wiring Board, so as to form a circuit-pattern on the substrate 20. The laser writer 10 includes a base 11, a fixed table 29, and a writing table 18. The fixed table 29 and the writing table 18 are arranged on the base 11. A laser 25 and an exposure optical system 15 that transmits a beam from the laser 25 toward the writing table 18, are mounted on the fixed table 29.

Two rails 12 are arranged on the base 10 and are parallel to each other. A table driving mechanism 13 drives the writing table 18 so that the writing table 18 moves along the pair of rails 12. The substrate 20 with a photo-resist layer is located on the writing table 18 when scanning the beam and writing the circuit-pattern. Hereinafter, a direction perpendicular to the moving direction of the writing table 18 is represented as a "main-scanning direction (Y-direction)", and a direction parallel to the moving direction of the writing table 18 is represented as a "sub-scanning direction (X-direction)".

A first beam bender 26 deflects a laser beam LB, which is emitted from the laser 25, to a beam splitter 27 and an AOM (Acousto-Optical Modulator) 28. The AOM modulates the laser beam LB by transmitting and intercepting the beam LB in accordance with the pattern-data. The laser beam LB passing through the AOM 28 is directed to a polygon mirror 36 via a second beam bender 30, lens 32, and a third beam bender 34.

A polygon mirror 36 having a polyhedron composed of mirrors deflects the leaser beam LB to an f-θ lens 38 so as to scan the beam LB along the main-scanning direction (Y-direction). The laser beam LB passing through the f-θ lens 38 is directed to the writing table 18 via a turning mirror 40, and a condenser lens 42, so that the laser beam LB is irradiated on the writing table 18.

While the laser 25 emits the laser beam LB, the polygon mirror 28 revolves at constant speed, and each mirror of the polygon mirror 28 scans the beam LB along a total of a scanning-line LL. The AOM 28 is turned ON, which interrupts the beam LB or turned OFF, which passes the beam LB, in accordance with the pattern-data. The writing table 18 moves along the sub-scanning direction (X-direction), so that the polygon mirror 18 scans the beam LB along each scanning line in order, while the writing table 18 moves. Consequently, a circuit-pattern is formed on the total surface of the substrate 20.

The beam splitter 27 splits the beam 25 emitted from the laser 25 into two beams, one beam LB being used for scanning, the other beam MB (hereinafter, called a "monitor beam") being used for measuring the beam-position on the substrate 20. The two beams LB and MB, parallel to each other, are directed to the polygon mirror 36, and the monitor beam MB is directed to a standard scale (herein not shown) by a mirror (not shown) which is provided between the turning mirror 40 and the condenser lens 42. The polygon mirror 36 deflects the monitor beam MB on the standard scale while synchronizing with the beam LB. Thus, the position of the scanning beam LB on the substrate 20 is measured by detecting the position of the monitor beam MB on the standard scale. The AOM 28 is controlled in accordance with the position of the scanning-beam LB.

Figure 2:
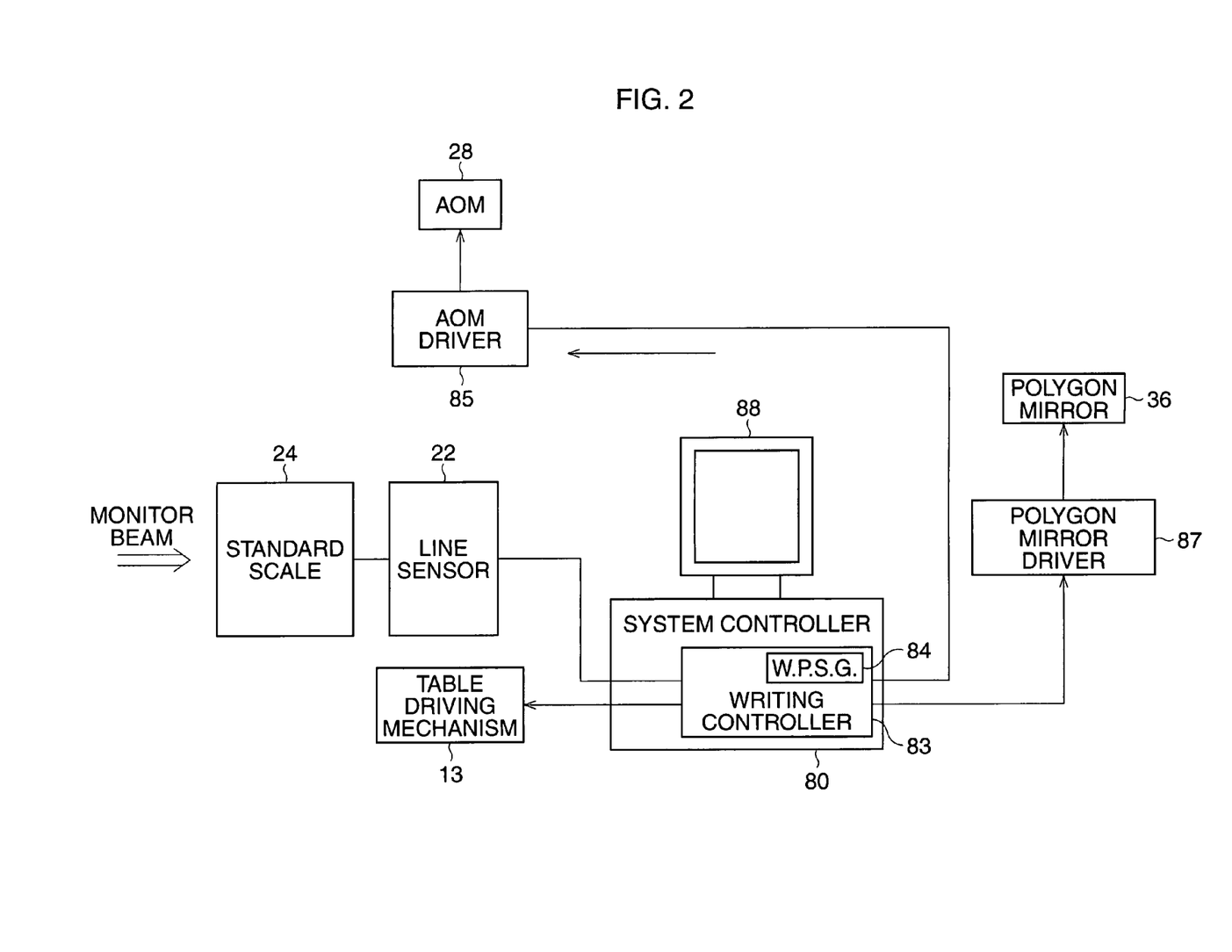
FIG. 2 is a block diagram of the laser writer.

FIG. 2 is a block diagram of the laser writer 10.

A system controller 80 controls the laser writer 10, and has a writing controller 83 and a monitor 88. The writing controller 83 with a writing pulse signal generator 84 outputs control signals to the table driving mechanism 13, the AOM driver 85, and a polygon mirror driver 87. The polygon mirror driver 87 revolves the polygon mirror 36 at a constant speed, and the table driving mechanism 13 shifts the writing table 18 at a constant-speed. The AOM driver 85 outputs control signals that turn the AOM 28 ON/OFF.

A line sensor 22 is provided at the rear of the standard scale 24, and extends along the standard scale 24. The line sensor 22 periodically detects the monitor beam MB passing through the standard scale 24, and outputs a detecting signal indicating the position of the monitor beam MB to the writing controller 83 in the system controller 80. The system controller 80 outputs driving signals to the table driving mechanism 13 in accordance with the detecting signal output from the line sensor 22, so as to shift the table driving mechanism 13 at a given speed corresponding to one line worth of scanning-time. The writing pulse signal generator 84 outputs a sequence of writing pulse signals to the AOM driver 85, which then outputs signals that turn the AOM 28 ON/OFF in accordance with the detecting signal of the monitor beam MB.

Figure 3:
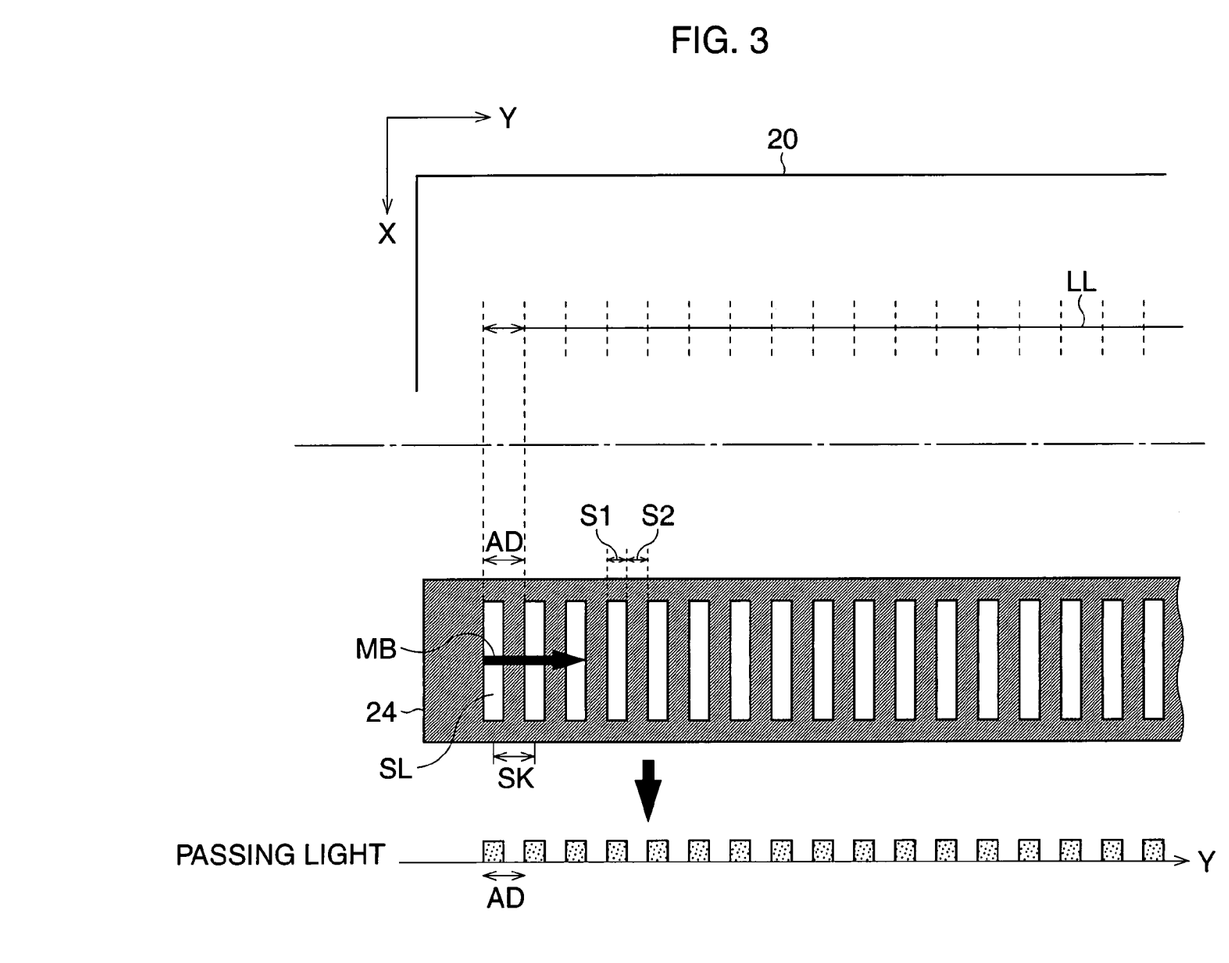
FIG. 3 is a view showing a standard scale.

FIG. 3 is a view showing the standard scale 24.

A plurality of slits "SL" is regularly and precisely formed on the standard scale 24 so that each interval between a slit and an adjacent slit is constant. The scanning-line "LL" is divided into a plurality of fine sections (intervals). The length of each fine interval "AD" corresponds to a sum of the width of the slit "S1", which transmits the monitor beam MB toward the line sensor 22, and the width of the interrupting portion, "S2", which interrupts the monitor beam MB. To precisely form the slits "SL" on the standard scale 24, the fine section "AD" is longer than a dot-pitch (dot-interval) of the pattern to be formed on the substrate 20. Since the width of the slit "S1" is the same as the width of the interrupting portion "S2", one fine section "AD" corresponds to a slit-pitch "SK". For example, one fine section "AD" is defined to 100 $\mu$m (100×10$^{-6}$ m).

While scanning the monitor beam MB on the standard scale 24, the pass and interruption of the monitor beam MB is repeated alternately. Consequently, a sequence of pulse signals (hereinafter, called "a series of scale signals") is output from the line sensor 22 to the writing controller 83. The position of the laser beam LB, which is synchronized with the monitor beam MB, is detected on the basis of the sequence of scale signals.

Figure 4:
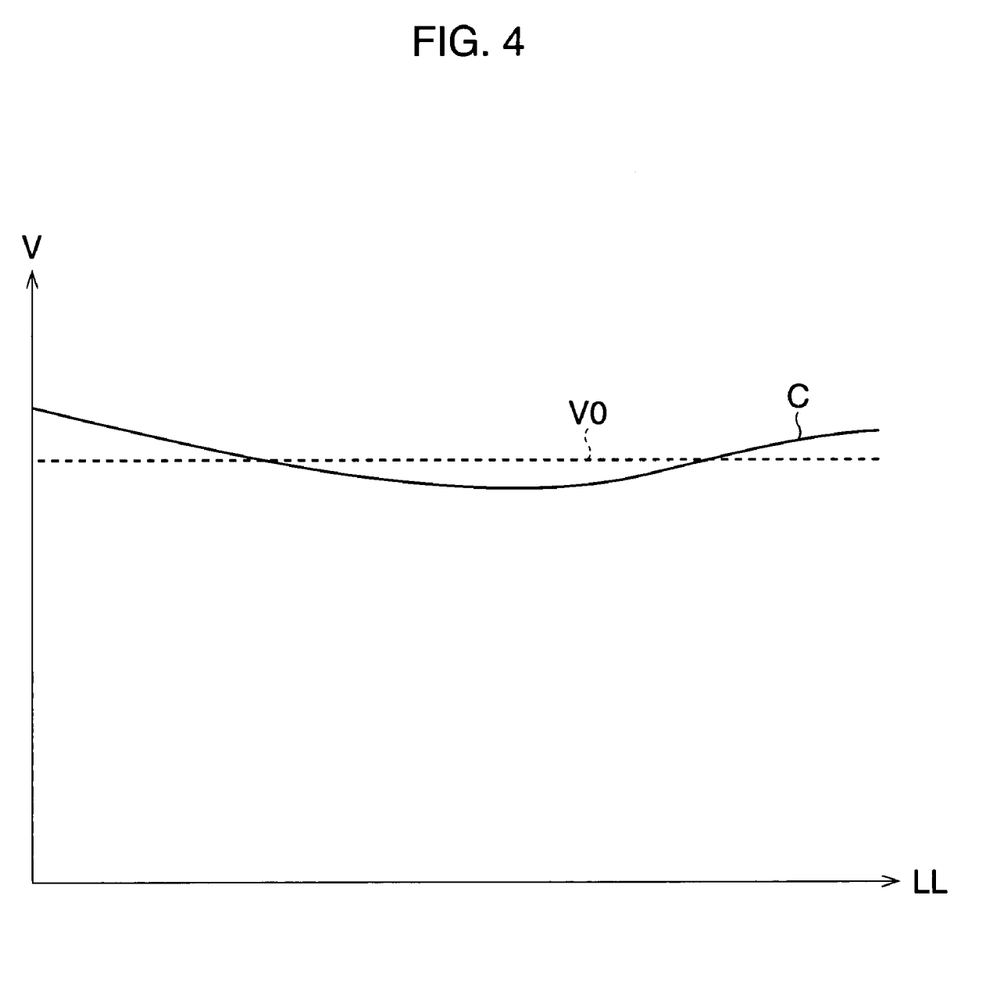
FIG. 4 is a view showing a scanning-speed.
Figure 5:
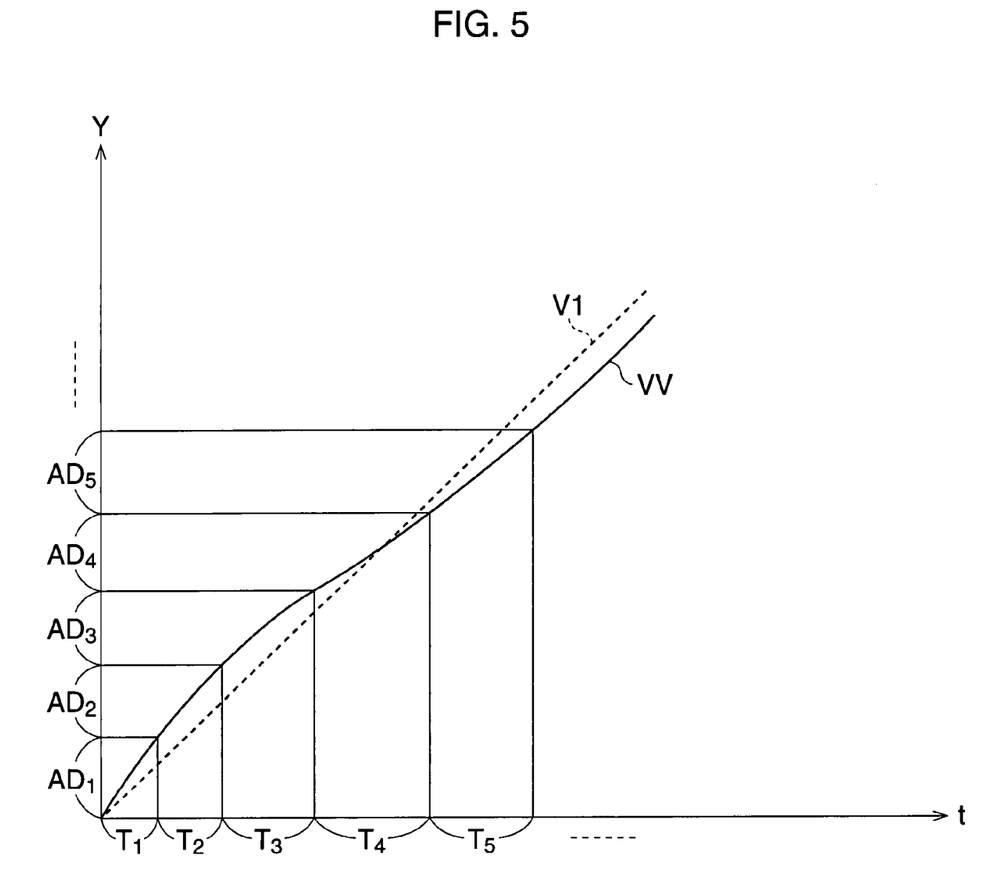
FIG. 5 is a view showing a shifted-distance of a monitor beam.

FIG. 4 is a view showing a scanning-speed, and FIG. 5 is a view showing a shifted-distance of the monitor beam MB. With reference to FIGS. 3 to 5, the characteristics of the scanning-speed are explained.

As shown in FIG. 4, the scanning-speed along the main-scanning direction (Y direction) is not constant due to the mirror-surface precision of the polygon 36, and the precision of the f-θ lens 38. Namely, the actual scanning-speed "V" is represented as a curved line "C", different from a straight line "V0".

In FIG. 5, the laser beam position, from a scanning start point, is shown as a function of time. The position of the laser beam LB is measured along the main-scanning direction (Y-direction). Since the scanning-speed is not constant, the locus of the beam position is not represented as a straight line "V1", but is represented as a curved line "VV".

Accordingly, the time that the laser beam LB takes to pass each fine section "AD" varies with the characteristics of the polygon mirror 36 and the f-θ lens 38. When an optional fine section is designated as "$AD_j$" (j=1, 2, . . . ), and a time-interval for the laser beam LB to pass along the fine section "$AD_j$" is designated as "$T_j$", time-interval "$T_j$" varies with the scanning-speed, while each of the fine sections "$AD_1$", "$AD_2$", "$AD_3$", . . . has the same length. For example, the time-interval "$T_1$" corresponding to the fine section "$AD_1$" is different from the time-interval "$T_3$" corresponding to the fine section "$AD_3$" (See FIG. 5). The time-interval "$T_j$" becomes short as the scanning-speed in the fine section "$AD_j$" becomes faster, whereas the time-interval "$T_j$" becomes long as the scanning-speed in the fine section "$AD_j$" becomes slower.

Figure 6:
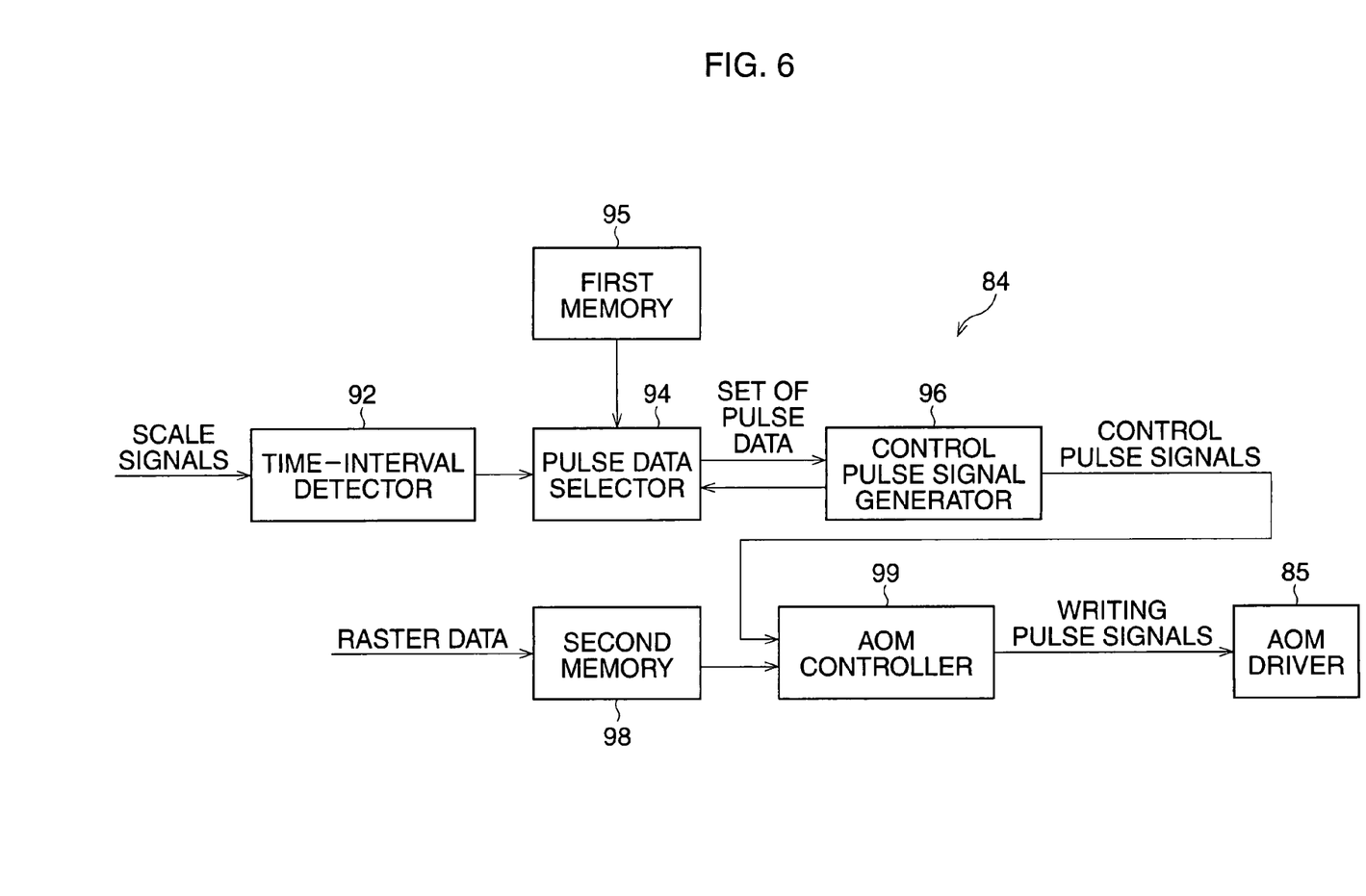
FIG. 6 is a block diagram of a writing pulse signal generator.
Figure 7:
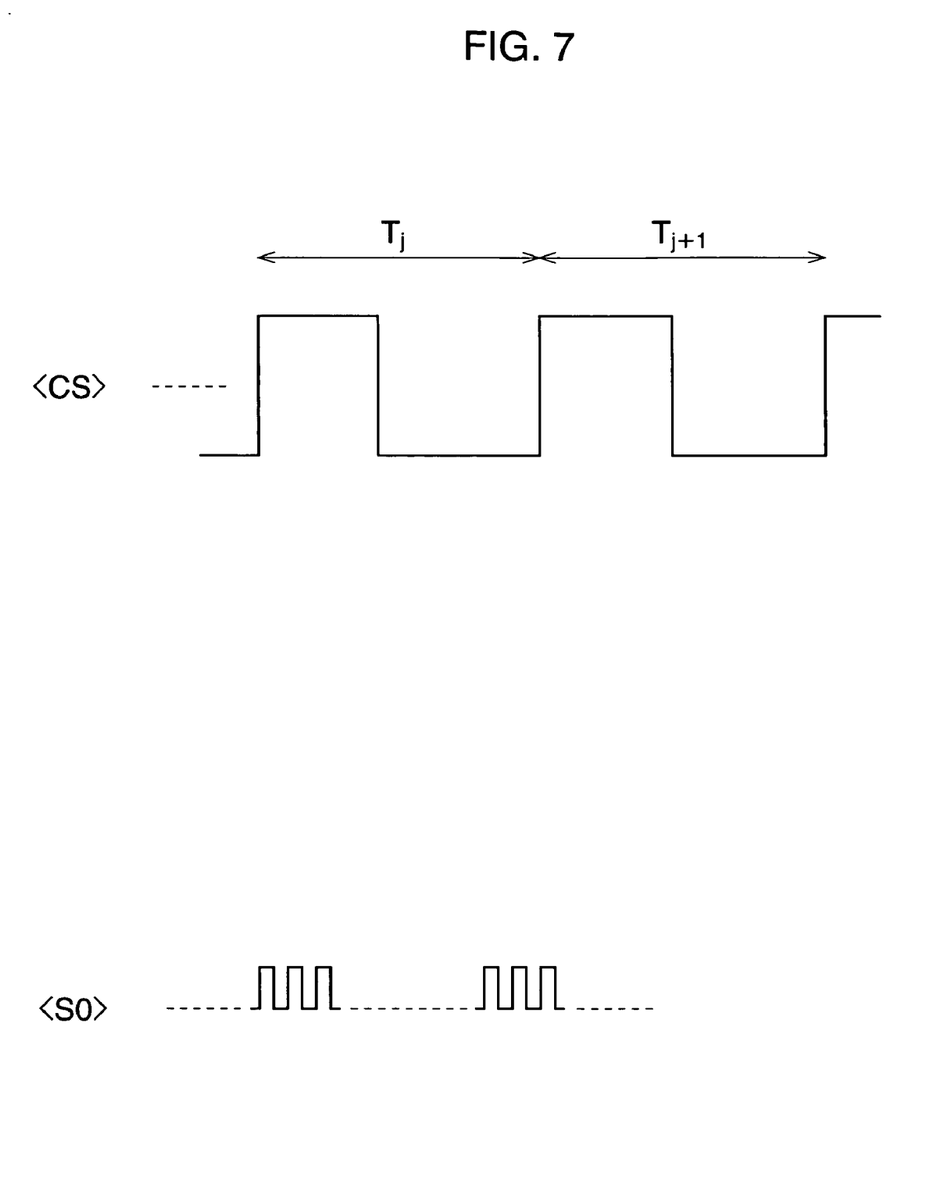
FIG. 7 is view showing a sequence of scale signals.
Figure 8:
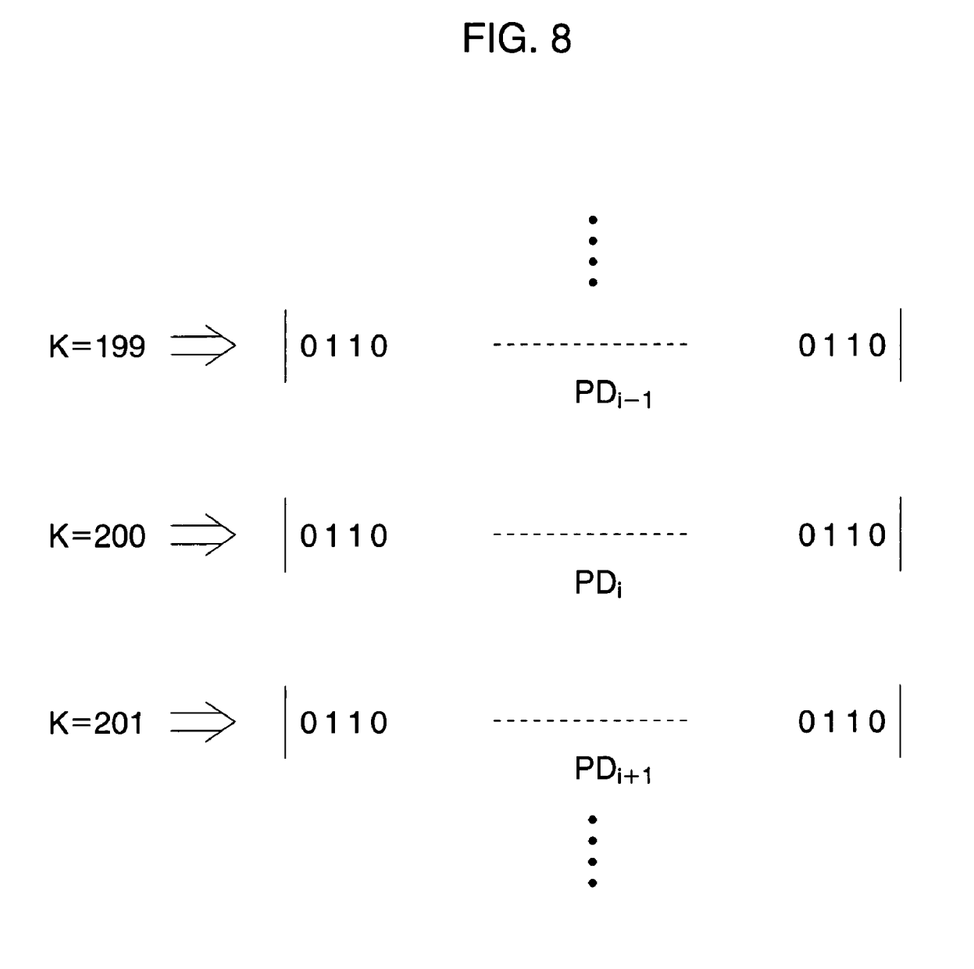
FIG. 8 is a view showing a series of sets of pulse data.
Figure 9:
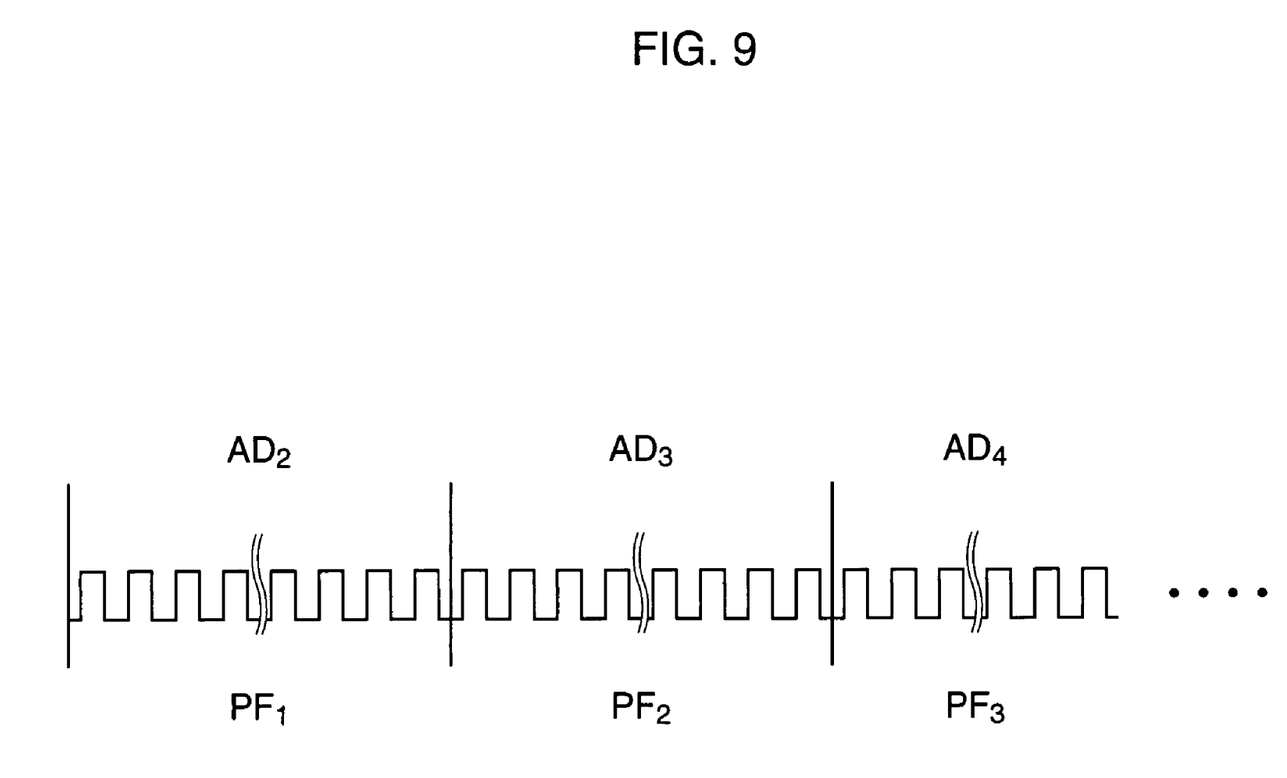
FIG. 9 is a view showing a sequence of control pulse signals.

FIG. 6 is a block diagram of the writing pulse signal generator 84, and FIG. 7 is a view showing the sequence of scale signals. FIG. 8 is a view showing a series of sets of pulse data, and FIG. 9 is a view showing a sequence of control pulse signals.

The writing pulse signal generator 84 has a time-interval detector 92, a pulse data selector 94, a first memory 95, a control pulse signal generator 96, a second memory 98, and an AOM controller 99. When the writing process is started, and the monitor beam MB scans the standard scale 24, the sequences of scale signals "CS" are fed to the time-interval detector 92 (See FIG. 7).

In the time-interval detector 92, the time-interval "$T_j$" is measured on the basis of a sequence of clock pulse signals "S0" having a frequency, substantially higher than that of the sequence of scale signals. In other words, one cycle of scale signals, corresponding to one section "$AD_j$", is measured by counting the pulse-number of the sequence of clock pulse signals "S0" (hereinafter, called "a sequence of standard clock pulse signals").

For example, when the fine section "$AD_j$" is 100 $\mu$m and the time-interval "$T_j$", which is obtained according to a predetermined scanning-speed, is 1 μs (1×10$^{-6}$ s), the frequency of the sequence of standard clock pulses "S0" is determined to 200 MHz. In this case, the cycle of standard clock pulse signals "CS" is 5 ns (5×10$^{-9}$ s), and the counted pulse number "K" is 200. Note that, the dot-pitch of the pattern is determined to 10 μm in the accordance with the above length of the fine section "AD$_j$" (100 μm). The pass-time for passing through the interval of the dot-pitch is 100 ns (100×10$^{-9}$ s).

As described above, since the scanning-speed varies with the position of the laser beam LB, the time-interval "T$_j$" varies in accordance with each fine section "AD$_j$". Therefore, the counted pulse number "K" does not necessarily coincide with a standard pulse number "K0" (for example, 200), which corresponds to the predetermined scanning-speed. The counted pulse-number occasionally becomes larger or smaller compared to the standard pulse number "K0".

In the first memory 95, a series of sets of pulse data "PD$_i$" (i=1, 2, . . . ) is stored in advance (See FIG. 8). Each set of pulse data "PD$_i$" has data that is composed of "0" and "1" and is periodically arranged, and defines a timing for turning the AOM 28 ON/OFF. The series of sets of pulse data "PD$_i$" correspond to an actually counted number "K" of the pulses, which varies with the scanning-speed. The pulse data selector 94 selects a set of pulse data corresponding to the counted number "K", namely, the time-interval "T$_j$" measured in the fine section "AD$_j$", from the series of sets of pulse data "PD$_i$" in the first memory 95. The selected set of pulse data is read from the first memory 95 and input to the pulse data selector 94.

The series of sets of pulse data "PD$_1$", "PD$_2$", . . . , are set such that a standard set of pulse data corresponding to the standard pulse-number "K0" becomes a central pulse data, and such that the remaining sets of pulse data correspond to continuously varying pulse-numbers "K", which vary from the standard pulse-number "K0". For example, The series of sets of pulse data "PD$_1$", "PD$_2$", . . . , "PD$_{i-1}$", "PD$_i$", "PD$_{i+1}$", . . . , which correspond to continuous pulse-numbers, . . . , 199, 200, 201, . . . (for example, 200±17), are set. The standard pulse number "K0" (=200) corresponds to the set of pulse data "PD$_i$" (See FIG. 8).

When the counted pulse-number "K" of the fine section "AD$_1$" is 199, the set of pulse data "PD$_{i-1}$", corresponding to the pulse number "199", is selected. The set of pulse data "PD$_{i-1}$" has 199 data composed of 0 and 1, which is periodically arranged in accordance with the scanning-speed in the section "AD$_1$". On the other hand, when the counted pulse number "K" of the fine section "AD$_2$" is 201, the set of pulse data "PD$_{i+1}$", corresponding to the pulse number "201", is selected.

The selected set of pulse data is output to the control pulse signal generator 96, wherein a sequence of control pulse signals "PF$_j$" (j=1, 2, . . . ) is generated on the basis of the standard clock pulse signals "S0" in each fine section "AD$_j$". The sequence of control pulse signals controls an output-timing of the sequence of writing pulse signals. After a sequence of control pulse signals corresponding to one fine section is generated, the control pulse signal generator 96 outputs a reset signal, which requires anew sequence of control pulse signals, to the pulse data selector 94. The pulse data selector 94 feeds the next selected set of pulse data to the control pulse signal generator 96.

The frequency of the sequence of control pulse signals "PF$_j$" corresponds to the measured corresponding time-interval "T$_j$", namely, the scanning-speed in the corresponding fine section "AD$_j$". The frequency and the waveform of the control pulse signals "PF$_j$" is defined in accordance with the data-array of the corresponding set of pulse data. For example, when the counted number "K" for the fine section "AD$_1$" is 199, the sequence of control pulse signals "PF$_1$" is generated on the basis of the set of pulse data "PD$_{i-1}$". On the other hand, when the counted number "K" for the fine section "AD$_2$" is 201, the sequence of control pulse signals "PF$_2$" is generated on the basis of the set of pulse data "PD$_{i+1}$". The frequency of the sequence of control pulse signals "PF$_1$" is lower than that of the sequence of control pulse signals "PF$_2$". The sequence of control pulse signals "PF$_j$", which is output from the control pulse signal generator 96, is fed to the AOM controller 99.

Raster data, which corresponds to a circuit-pattern and is fed from a computer system (not shown), is temporarily stored in the second memory 98. Then, the raster data is output from the second memory 98 to the AOM controller 99 in order. The AOM controller outputs the raster data to the AOM driver 85 as the "sequence of writing pulse signals", while synchronizing the raster data with the sequence of control pulse signals "PF$_j$".

When the scanning-speed in the fine section "AD$_j$" is slower, the frequency of the sequence of control pulse signals "PF$_j$" becomes a lower frequency, so that the output time-interval of the sequence of writing pulse signal in the AOM controller 99 becomes longer. On the other hand, when the scanning-speed in the fine section "AD$_j$" is faster, the frequency of the sequence of control pulse signals "PF$_j$" becomes a higher frequency, so that the output time-interval of the sequence of writing pulse signals becomes shorter. Thus, the image-density, namely, the dot-interval is maintained to a constant-interval regardless of the varying scanning-speed.

Note that, the sequence of control pulse signals is not directly used for a fine section that the laser beam LB currently passes, but is used for an adjacent next fine section. For example, the sequence of control pulse signals "PF$_2$" is generated when the laser beam LB passes the fine section "AD$_2$", the sequence of control pulse signals "PF$_2$" is utilized for controlling the AOM 28 in the next fine section "AD$_3$". However, since the length of each fine section is micrometer-order and the scanning-speed does not vary rapidly, the scanning-speed between the two fine sections adjacent to each other is regarded as a "substantially constant-speed". Therefore, the AOM 28 can be controlled in accordance with the sequence of control pulse signals corresponding to the previous fine section.

In this way, the laser writer 10 generates a sequence of control pulse signals without a PLL circuit, and on the basis of the scanning-speed detected in real time. Thus, the laser writer 10 can rapidly respond to the varying scanning-speeds. Further, since the series of sets of pulse data is stored in the first memory 95 in advance, the length of the fine section "AD$_j$" can be optionally set in accordance with a pattern.

The position of the beam LB may be detected by detecting a rotation-position of the polygon mirror 36 instead of using of the standard scale 24. Another optical modulator may be applied instead of the AOM 28. An alternate exposure optical system may be used. The length of the fine section may be defined such that the length is longer than the dot-pitch, or dot-interval.

A laser scanner using a photoreceptor may be applied instead of the laser writer using the substrate.

Finally, it will be understood by those skilled in the art that the foregoing description is of preferred embodiments of the device, and that various changes and modifications may be made to the present invention without departing from the spirit and scope thereof.

The present disclosure relates to subject matters contained in Japanese Patent Application No.2003-126309 (filed on May 1, 2003), which is expressly incorporated herein, by reference, in its entirety.

What is claimed is:

1. An apparatus for forming a pattern comprising:
    a light source that emits a beam;
    a scanning unit that scans the beam on a photosensitive material;
    a time-interval detector that successively detects a time-interval that is a pass-time of the beam in each section of a series of fine sections, said series of fine sections being defined by dividing a scanning-line at constant-intervals larger than a dot-pitch;
    a memory that is capable of storing a series of sets of pulse data that have a different data-array in accordance with the time-interval;
    a pulse data selector that selects a set of pulse data, corresponding to the detected time-interval, from the series of sets of pulse data;
    a control pulse signal generator that successively generates a sequence of control pulse signals in accordance with the selected set of pulse data;
    a writing pulse signal generator that successively generates a sequence of writing pulse signals in accordance with the sequence of control pulse signals, the sequence of control pulse signals controlling the output-timing of the sequence of writing pulse signals; and
    an optical modulator that modulates the beam in accordance with the sequence of writing pulse signals.

2. The apparatus of claim 1, wherein said time-interval detector detects the time-interval by using a sequence of standard clock pulse signals with a given frequency that is higher than a frequency necessary for counting a time-interval corresponding to the dot-pitch.

3. The apparatus of claim 1, wherein the series of sets of pulse data comprises a standard set of pulse data that corresponds to a standard time-interval detected by using a predetermined scanning-speed, and a plurality of corrected pulse data that respectively correspond to a plurality of correcting time-intervals that vary continuously and that deviate from the standard time-interval.

4. The apparatus of claim 1, wherein said time-interval detector comprises a standard scale that has a plurality of slits, the slits being regularly formed at a constant-interval, the length of a fine section being defined in accordance with a slit-pitch;
    wherein said scanning unit comprises a beam splitter that splits the beam from said light source into a scanning-beam for scanning and a monitor-beam for detecting a position of the scanning-beam, said scanning unit scanning the monitor beam on said standard scale, said time-interval detector detecting the time-interval on the basis of a sequence of scale signals obtained from passing-light that passes the slits periodically.

5. The apparatus of claim 1, wherein said optical modulator comprises an AOM (Acousto-Optical Modulator).

6. The apparatus of claim 1, wherein said scanning unit comprises a polygon mirror and an f-θ lens.

7. An apparatus for generating a sequence of control pulse signals comprising:
    a time-interval detector that successively detects a time-interval that is a pass-time of the beam in each section of a series of fine sections, said series of fine sections being defined by dividing a scanning-line at constant-intervals larger than a dot-pitch;
    a memory that is capable of storing a series of sets of pulse data that have a different data-array in accordance with the time-interval;
    a pulse data selector that selects a set of pulse data, corresponding to the detected time-interval, from the series of sets of pulse data; and
    a control pulse signal generator that successively generates a sequence of control pulse signals in accordance with the selected set of pulse data, the sequence of control pulse signals controlling the output-timing of a sequence of writing pulse signals for controlling an optical modulator.

8. A method for generating a sequence of control pulse signals comprising:
    detecting successively a time-interval that is a pass-time of a beam in each section of a series of fine sections, said series of fine sections being defined by dividing a scanning-line at constant-intervals larger than a dot-pitch;
    selecting a set of pulse data, corresponding to the detected time-interval, from a series of sets of pulse data, the series of sets of pulse data having a different data-array in accordance with the time-interval; and
    successively generating a sequence of control pulse signals in accordance with the selected set of pulse data, the sequence of control pulse signals controlling the output-timing of a sequence of writing pulse signals for controlling an optical modulator.

* * * * *